(12) United States Patent  (10) Patent No.: US 7,746,666 B2
Kakinoki et al.  (45) Date of Patent: Jun. 29, 2010

(54) SHIELD CASE

(75) Inventors: Wataru Kakinoki, Yokohama (JP); Yukio Nakazawa, Komatsu (JP); Kenji Hayashikoshi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 396 days.

(21) Appl. No.: 11/575,813

(22) PCT Filed: Jul. 21, 2005

(86) PCT No.: PCT/JP2005/013394

§ 371 (c)(1),
(2), (4) Date: Mar. 22, 2007

(87) PCT Pub. No.: WO2006/035542

PCT Pub. Date: Apr. 6, 2006

(65) Prior Publication Data

US 2008/0062668 A1    Mar. 13, 2008

(30) Foreign Application Priority Data

Sep. 27, 2004 (JP) .............................. 2004-279752

(51) Int. Cl.
*H05K 9/00* (2006.01)
(52) U.S. Cl. ...................................... 361/816; 361/818
(58) Field of Classification Search ................. 361/760, 361/816, 818, 800–802; 174/35 R, 51
See application file for complete search history.

(56) References Cited

U.S. PATENT DOCUMENTS

| 5,495,399 A | | 2/1996 | Gore et al. |
| 5,644,101 A | | 7/1997 | Elliott |
| 5,844,784 A | * | 12/1998 | Moran et al. ................. 361/818 |
| 6,246,011 B1 | | 6/2001 | Abraham et al. |
| 6,384,324 B2 | * | 5/2002 | Flegeo ......................... 174/390 |
| 7,138,584 B1 | * | 11/2006 | Ju ............................... 174/379 |
| 2002/0166683 A1 | | 11/2002 | Shlahtichman et al. |
| 2002/0185294 A1 | | 12/2002 | Shlyakhtichman et al. |

FOREIGN PATENT DOCUMENTS

| CN | 1083655 | 3/1994 |
| EP | 1 420 623 | 5/2004 |
| JP | 61-57593 | 4/1986 |

(Continued)

OTHER PUBLICATIONS

Written Opinion with English Translation.

(Continued)

*Primary Examiner*—Hung S Bui
(74) *Attorney, Agent, or Firm*—Keating & Bennett, LLP

(57) ABSTRACT

A shield case is fixed to a surface of a circuit board with a conductive joining material so as to cover a shielded portion on the circuit board surface. The shield case includes joint terminals extending outward and inclined upward from a lower edge thereof that is in contact with the circuit board surface. The joint terminals are joined to the circuit board surface with the conductive joining material provided therebetween. The shield case can thereby be fixed to the circuit board surface, and grounded to a ground portion provided on the circuit board.

16 Claims, 5 Drawing Sheets

FOREIGN PATENT DOCUMENTS

| | | |
|---|---|---|
| JP | 1-165697 | 11/1989 |
| JP | 3-104197 | 5/1991 |
| JP | 3-104198 | 5/1991 |
| JP | 6-13522 | 1/1994 |
| JP | 6-53621 | 2/1994 |
| JP | 7-147495 | 6/1995 |
| JP | 9-312454 | 12/1997 |
| JP | 2001-217588 | 8/2001 |

OTHER PUBLICATIONS

International Search Report issued Oct. 4, 2005 with English language translation.
Office Action issued May 30, 2008 in corresponding Chinese Application No. 200580032443.8, with English language translation.
International Search Report issued Jul. 11, 2008.

* cited by examiner

SHIELD CASE

CROSS-REFERENCE TO RELATED APPLICATION

The present application is a 35 U.S.C. §371 national phase conversion of PCT/JP2005/013394 filed on Jul. 21, 2005, which claims priority of Japanese Patent Appln. No. 2004-279752 filed Sep. 27, 2004 incorporated by reference.

BACKGROUND OF THE INVENTION

The present invention relates to a shield case that covers and shields a shield portion on a surface of a circuit board.

BACKGROUND ART

FIG. 5a is a schematic perspective view showing an example of a shield case along with a circuit board (for example, see Patent Document 1), and FIG. 5b illustrates an exploded state of the shield case shown in FIG. 5a. This shield case 40 covers and shields a shielded portion on a surface 41a of a circuit board 41. In this example, the shield case 40 includes a frame 42 formed of a conductor and a cover 43 formed of a conductor.

The frame 42 is defined by a peripheral wall that surrounds the shielded portion on the circuit board surface 41a. The frame 42 has joint terminals 44 extending outward along the circuit board surface 41a from a lower edge of the frame 42 that is in contact with the circuit board surface 41a. As shown in FIG. 5c as a schematic cross-sectional view, the joint terminals 44 are joined to the circuit board surface 41a with solder 45 provided therebetween, and the frame 42 is thereby fixed to the circuit board surface 41a. A ground electrode (not shown) is provided on a portion of the circuit board surface 41a to which the joint terminals 44 are joined. When the joint terminals 44 (frame 42) are joined to the circuit board surface 41a with the solder 45, and are connected to the ground electrode, they are grounded to a ground portion of the circuit board 41 via the ground electrode on the circuit board surface 41a.

The cover 43 has peripheral portions 46 to be fitted on the outer peripheral surface of the frame 42. The cover 43 is combined with the frame 42 with the peripheral portions 46 fitted on the outer peripheral surface of the frame 42, thereby covering the shielded portion on the circuit board surface 41a. By being fitted on and combined with the frame 42, the cover 43 is grounded to the ground portion of the circuit board 41 via the frame 42, and shields the shielded portion on the circuit board surface 41a.

Reference numeral 47 in FIGS. 5a and 5b denotes components that constitute a circuit mounted on the circuit board 41.

Patent Document 1: Japanese Unexamined Patent Application Publication No. 7-147495

Patent Document 2: Japanese Unexamined Utility Model Registration Application Publication No. 1-165697

Patent Document 3: Japanese Unexamined Patent Application Publication No. 6-13522

During the process of joining the joint terminals 44 of the frame 42 to the circuit board surface 41a with the solder 45, for example, the solder 45 provided between the joint terminals 44 of the frame 42 and the circuit board surface 41a is melted by heating. The solder 45 is thereby joined to the joint terminals 44 and the circuit board surface 41a, and the joint terminals 44 are joined to the circuit board surface 41a by the solder 45. In this process, when the solder 45 is melted by heating, the molten solder 45 is pressed between the joint terminals 44 and the circuit board surface 41a by a pressing force applied from the joint terminals 44 to the solder 45 by the weight of the frame 42. Consequently, the molten solder 45 is partly squeezed from between the joint terminals 44 and the circuit board surface 41a.

A first problem relates to the strength of the joints between the frame 42 and the circuit board surface 41a. In consideration of the joint strength between the joint terminals 44 and the circuit board surface 41a, it is preferable that the squeezed solder 45 flow up an inner peripheral surface of the frame 42 and end faces of the joint terminals 44, and form fillets, as shown by sections Z in FIG. 5c, to join the frame 42 (joint terminals 44) and the circuit board surface 41a.

However, the solder 45 sometimes cannot form fillets at the leading end faces of the joint terminals 44, and this can reduce the joint strength between the frame 42 (joint terminals 44) and the circuit board surface 41a. For example, when the joint terminals 44 are made of a metal material (e.g., iron or stainless steel) to which the solder 45 is not easily joined, both front and back sides of the joint terminals 44 are treated (for example, by solder plating, copper plating, or nickel plating) so that the solder 45 can be easily joined thereto. The leading ends of the joint terminals 44 are sometimes cut after the treatment. In this case, the metal material to which the solder 45 is not easily joined is exposed from the leading end faces of the joint terminals 44. For this reason, it is impossible for the molten solder 45 to flow up the leading end faces of the joint terminals 44 and form satisfactory fillets. Even if the leading end faces of the joint terminals 44 are formed of a material to which the solder 45 is easily joined, for example, when they are roughened by cutting, the solder 45 cannot flow up the leading end faces of the joint terminals 44, as described above. That is, satisfactory fillets of the solder 45 sometimes cannot be formed at the leading end faces of the joint terminals 44. If satisfactory fillets cannot be formed at the leading end faces of the joint terminals 44 in this way, the joint strength between the frame 42 (joint terminals 44) and the circuit board surface 41a is decreased.

A second problem relates to the joint strength between the frame 42 and the cover 43. Since the joint terminals 44 are substantially parallel to the circuit board surface 41a in the structure of the shield case 40, the distance between the joint terminals 44 and the circuit board surface 41a is substantially constant over the entire region. For this reason, the pressing force applied from the joint terminals 44 to the solder 45 by the weight of the frame 42 is substantially uniform over the entire region between the joint terminals 44 and the circuit board surface 41a. Therefore, when the solder 45 is molten, the molten solder 45 is squeezed from the entire region between the joint terminals 44 and the circuit board surface 41a, which tends to increase the amount of the squeezed molten solder 45. Consequently, the squeezed molten solder 45 partly flows up the joint terminals 44, further flows up the outer peripheral surface of the frame 42, and easily reaches a portion of the frame 42 to be fitted in the cover 43. Since the cover 43 is fitted on the frame 42 after the frame 42 is joined to the circuit board surface 41a with the solder 45, if the solder 45 reaches the fitting portion between the frame 42 and the cover 43 during the process for joining the frame 42 to the circuit board surface 41a, the solder 45 lies at the fitting portion between the frame 42 and the cover 43 when the frame 42 and the cover 43 are fitted together. This worsens the fitting state between the frame 42 and the cover 43. When the fitting state between the frame 42 and the cover 43 is thus worsened, the electric connection therebetween becomes unstable, and the potential of the cover 43 cannot be stabilized at the ground potential.

A third problem relates to inspection of the solder. Since the joint terminals 44 of the frame 42 are substantially parallel to the circuit board surface 41a in the structure of the shield case 40 shown in FIG. 5a, the solder 45 between the joint terminals 44 and the circuit board surface 41a is hidden by the joint terminals 44, and cannot be viewed from above the circuit board surface 41a. Consequently, it is difficult to visually check whether the state of the solder 45 between the joint terminals 44 and the circuit board surface 41a is good or not. Further, since the joint terminals 44 are substantially parallel to the circuit board surface 41a, they are easily affected by variations in coplanarity, and the solder frequently does not adhere to the terminals.

SUMMARY OF THE INVENTION

The present invention addresses the above problems by means of the following features. According to one feature of the invention, a shield case is fixed to a surface of a circuit board with a conductive joining material so as to cover a shielded portion on the surface of the circuit board, wherein the shield case includes joint terminals extending outward and inclined upward from a lower edge of the shield case that is in contact with the surface of the circuit board, and wherein the shield case is fixed to the surface of the circuit board and is grounded to a ground portion of the circuit board by joining the joint terminals to the surface of the circuit board with the conductive joining material provided therebetween.

With this feature of the invention, the joint terminals of the shield case extend outward and are inclined upward from the lower edge of the shield case. For this reason, the distance between the joint terminals and the circuit board surface increases from the base ends of the joint terminals toward the leading ends. This increase allows more conductive joining material to be provided between the joint terminals and the circuit board surface than when the joint terminals extend along the circuit board surface. This easily increases the joint strength between the joint terminals of the shield case and the circuit board surface with the conductive joining material.

Since the distance between the leading ends of the joint terminals and the circuit board surface is longer than the distance between the base ends of the joint terminals and the circuit board surface, more joining material can be provided at the leading ends of the joint terminals than at the base ends. Therefore, even when fillets of the joining material are not formed at the leading ends of the joint terminals, a desirable joint strength can be ensured between the joint terminals and the circuit board surface. Accordingly, it is possible to prevent the joint strength between the joint terminals and the circuit board surface from being decreased when fillets are not easily formed at the leading ends of the joint terminals (for example, when leading end faces of the joint terminals are formed of a material that is not easily joined to the joining material, or the leading end faces are rough).

Further, with this feature of the invention, the joint terminals extending from the lower edge of the shield case can function as adjustable legs of the shield case. Therefore, when the joint terminals are inclined upward by being bent at the base ends, the shield case can be easily prevented from rattling when placed on the circuit board surface by adjusting the positions of the bent portions. This helps to avoid a defective joint terminal that is not joined to the circuit board surface because it is out of contact therewith. Thus, for example, it is unnecessary to perform a troublesome special operation for joining the shield case and the circuit board surface in a manner depending on the degree of rattling of the shield case with respect to the circuit board surface, so that the shield case can be properly joined more easily to the circuit board surface. Accordingly, the shield case with this feature is satisfactorily capable of automatic mounting, and achieves high mass productivity.

With the features described herein, it is easy to properly join the joint terminals of the shield case to the circuit board surface with the conductive joining material. Therefore, the entire shield case can be stably grounded to the ground portion of the circuit board via the joint portions between the joint terminals and the circuit board surface. This stabilizes the ground potential of the shield case, and enhances the reliability of shielding performance of the shield case.

Since the distance between the joint terminals and the circuit board surface increases from the base ends of the joint terminals toward the leading ends, the joining material provided between the joint terminals and the circuit board surface can be easily viewed from above the circuit board surface. For this reason, it is easy to visually check the state of the joint between the joint terminals and the circuit board surface with the joining material, and the operation efficiency during the checking process is enhanced.

Other features and advantages of the present invention will become apparent from the following description of embodiments of invention which refers to the accompanying drawings.

BRIEF DESCRIPTION OF THE DRAWINGS

FIG. 1b is a cross-sectional view taken along line A-A in FIG. 1a.

FIG. 1c is a cross-sectional view taken along line B-B in FIG. 1a.

FIG. 2 is a schematic exploded view of the shield case shown in FIG. 1a.

FIG. 3a is a model diagram of a frame in a comparative example used to explain one of the advantages obtained by a frame that constitutes the shield case shown in FIG. 1a.

FIG. 3b is a schematic cross-sectional view of a lower edge of the frame shown in FIG. 3a.

FIG. 3c is an enlarged perspective view schematically showing an example of a shape of a lower edge of the frame of the shield case shown in FIG. 1a.

FIG. 5a is an explanatory view of a known shield case.

FIG. 5b is a schematic exploded view of the shield case shown in FIG. 5a.

Figure 1A:
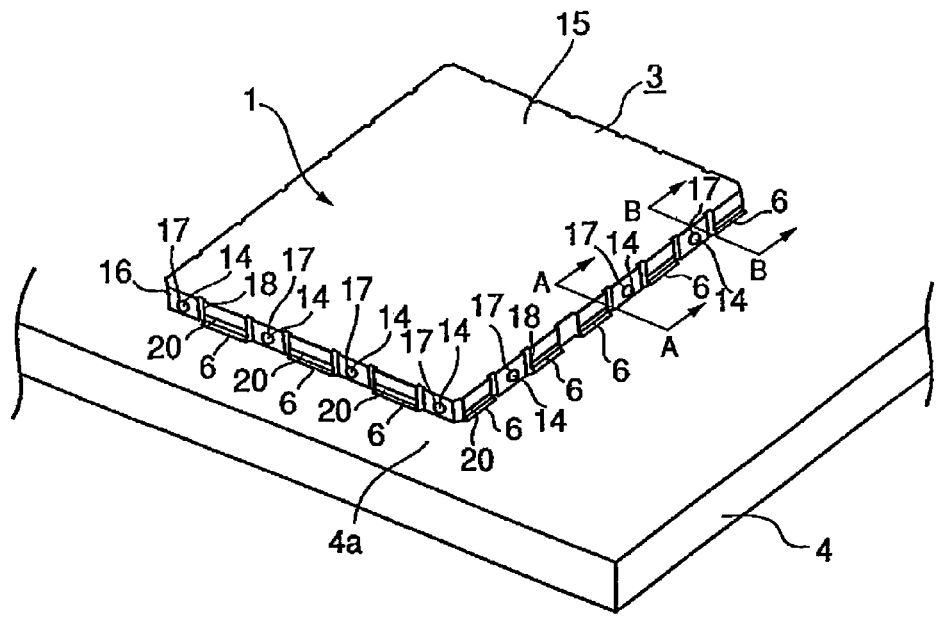
FIG. 1a is a schematic perspective view explaining a shield case according to an embodiment of the present invention.

REFERENCE NUMERALS 1 shield case
2 frame
3 cover
4 circuit board
5 peripheral wall
6 joint terminal
7 solder
12 positioning projection
13 positioning hole
14 protuberance
17 opening
20 elastic retaining portion

DETAILED DESCRIPTION OF EMBODIMENTS OF THE INVENTION

Embodiments of the present invention will be described below with reference to the drawings.

Figure 1B:
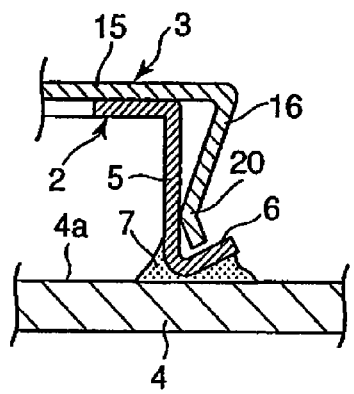
Figure 1C:
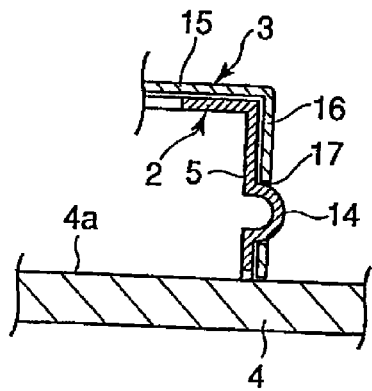
Figure 2:
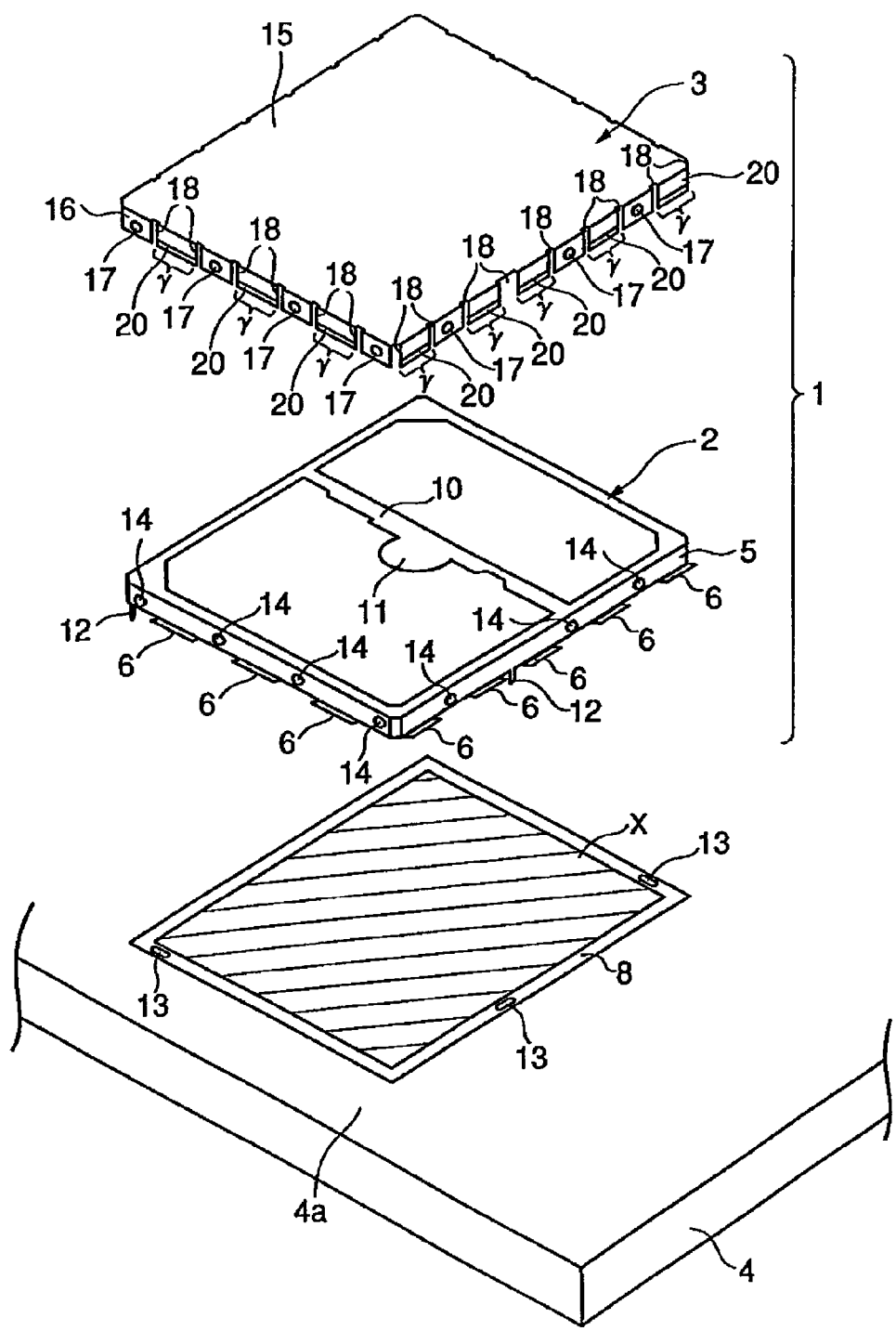

FIG. 1a is a schematic perspective view showing a shield case according to an embodiment of the present invention, along with a circuit board, FIG. 1b is a schematic cross-sectional view taken along line A-A in FIG. 1a, and FIG. 1c is a schematic cross-sectional view taken along line B-B in FIG. 1a. FIG. 2 schematically shows an exploded state of the shield case. A shield case 1 of this embodiment includes a frame 2 formed of a conductor and a cover 3 formed of a conductor that will be described below.

The frame 2 includes a peripheral wall 5 that surrounds a predetermined shielded portion (a diagonally shaded portion shown in FIG. 2) X on a surface 4a of a circuit board 4. The peripheral wall 5 has joint terminals 6 provided at a lower edge thereof so as to be in contact with the circuit board surface 4a. The joint terminals 6 extend outward from the lower edge of the peripheral wall 5, and are inclined upward (for example, at an angle of 45° to the circuit board surface 4a) (see FIG. 1b). In this embodiment, a plurality of joint terminals 6 are disposed at intervals along and at the lower edge of the peripheral wall 5. The joint terminals 6 are joined to the circuit board surface 4a with solder 7 serving as a conductive joining material provided therebetween, so that the frame 2 is fixed to the circuit board surface 4a.

In this embodiment, an electrode 8 is provided on the circuit board surface 4a correspondingly to the peripheral wall 5 of the frame 2 in a manner such as to surround the shielded portion X (see FIG. 2). The electrode 8 is connected to a ground portion (not shown) of the circuit board 4 by a connecting means (not shown). In this embodiment, the frame 2 is placed on the circuit board surface 4a while the lower edge of the peripheral wall 5 is aligned with the electrode 8 of the circuit board 4, and the joint terminals 6 of the frame 2 are joined to the circuit board surface 4a with the solder 7. Consequently, the frame 2 is connected to the electrode 8 of the circuit board 4 via the solder 7, and is grounded to the ground portion of the circuit board 4 via the electrode 8.

In this embodiment, the frame 2 is a component capable of automatic mounting. That is, the frame 2 includes a beam 10 that extends between opposing upper edge portions of the peripheral wall. A suction face 11 having a large area is provided at the center of the beam 10 so as to be drawn with a component-transporting suction nozzle. By drawing the suction face 11 by the component-transporting suction nozzle, for example, the frame 2 can be automatically transported from a component storage tray onto the circuit board surface 4a. The position of the suction face 11 is designed in consideration of the center of gravity of the frame 2 so that the frame 2 is not tilted, but is placed in a stable position when the suction face 11 is drawn by the suction nozzle.

Positioning projections 12 protrude downward from the lower edge of the peripheral wall 5 of the frame 2. In this embodiment, the positioning projections 12 are spaced at a plurality of positions at the lower edge of the peripheral wall 5. The circuit board 4 has positioning holes 13 provided at the positions corresponding to the positioning projections 12 of the frame 2. When the positioning projections 12 of the frame 2 are fitted in the corresponding holes 13 of the circuit board 4, the frame 2 is positioned on the circuit board surface 4a. That is, when the frame 2 is manually placed on the circuit board surface 4a, and when the frame 2 is automatically transported onto the circuit board surface 4a, it can be precisely positioned at a predetermined mounting position on the circuit board surface 4a by simply fitting the positioning projections 12 of the frame 2 in the positioning holes 13 of the circuit board.

Figure 3A:
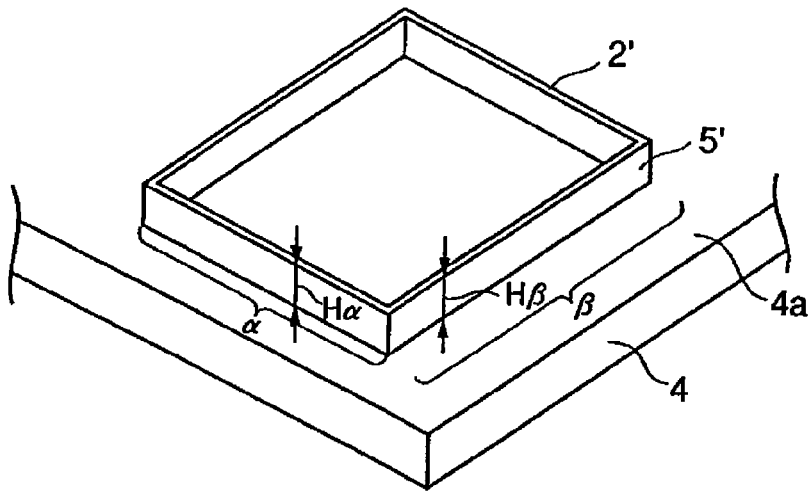
Figure 3B:
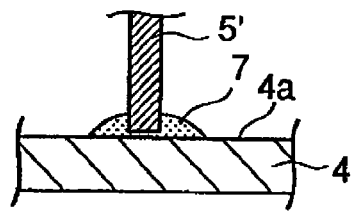

In a comparative example, shown in FIGS. 3a and 3b, it is assumed that a peripheral wall 5' of a frame 2' does not have joint terminals, as shown in FIG. 3a as a simplified view. Because of limited working accuracy, for example, a difference is apt to arise between the length Hα between the upper and lower edges of a portion α of the peripheral wall 5', and the length Hβ between the upper and lower edges of a portion β. In a case in which the height between the upper and lower edges of the peripheral wall 5' varies among the portions in this way, when the frame 2' is placed on the circuit board surface 4a, the lower edge of the peripheral wall 5' cannot be entirely in contact with the circuit board surface 4a, but is partly lifted off from the circuit board surface 4a. Since joint terminals are not provided in the structure shown in FIG. 3a, the lower edge of the peripheral wall 5' is directly joined to the circuit board surface 4a with solder 7, as shown in FIG. 3b as a schematic cross-sectional view. For this reason, there is a danger that the portion of the lower edge of the peripheral wall 5' out of contact with the circuit board surface 4a will not be joined to the circuit board surface 4a.

Figure 3C:
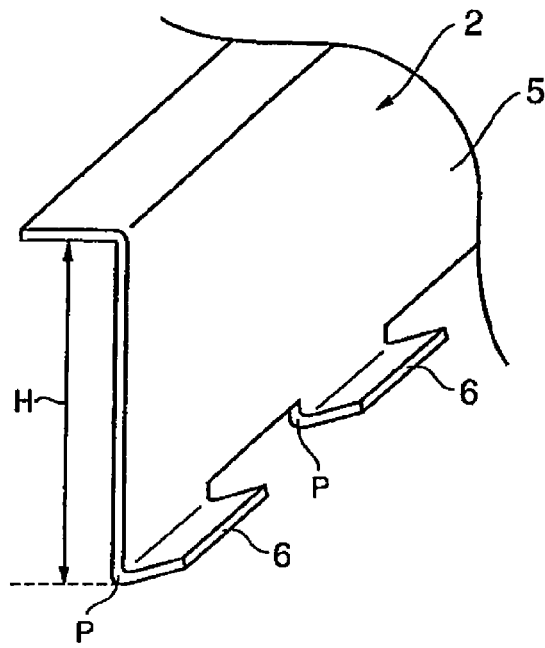

In contrast, in this embodiment, the joint terminals 6 extend from the lower edge of the peripheral wall 5 in the frame 2, as shown in FIG. 3c as a model diagram. In this embodiment, the joint terminals 6 are formed by bending a metal plate. By adjusting the bending positions P, the length H between the upper end of the frame 2 and the bending positions P can be made uniform over the entire periphery of the frame 2. Consequently, the frame 2 can be placed on the circuit board surface 4a without rattling, and can be properly and easily joined to the circuit board surface 4a. This is also highly relevant to automatic mounting of the frame 2.

Also in this embodiment, as shown in FIG. 2, protuberances 14 project outward from portions of the peripheral wall 5 where the joint terminals 6 are not provided. In this embodiment, the protuberances 14 are formed by extrusion, as shown in FIG. 1c.

The cover 3 includes a cover main portion 15 shaped like a flat plate to cover the shielded portion X of the circuit board surface 4a, and a peripheral portion 16 to be fitted on the outer surface of the peripheral wall 5 of the frame 2. The peripheral portion 16 has openings 17 provided correspondingly to the positions of the protuberances 14 of the peripheral wall 5 of the frame 2 so that the protuberances 14 are fitted therein. Therefore, when the peripheral wall 5 of the frame 2 and the outer surface of the peripheral portion 16 of the cover 3 are fitted, the protuberances 14 of the peripheral wall 5 of the frame 2 are fitted in the openings 17 of the peripheral portion 16 of the cover 3. The cover 3 is thereby prevented from falling off the frame 2, and can be combined with the frame 2. That is, the protuberances 14 of the frame 2 and the openings 17 of the cover 3 serve as fitting portions for combination.

Regions γ of the peripheral portion 16 of the cover 3 corresponding to the areas of the frame 2 where the joint terminals 6 are provided (see FIG. 2) serve as elastic retaining portions 20 that are to be in pressing contact with the areas of the joint terminals 6. That is, each of the regions γ corresponding to the areas of the joint terminals 6 is shaped like a tongue having slits 18 on both sides. The tongue portion of the region γ is bent in the shape shown in FIG. 1b, and is elastically deformable outward.

In this embodiment, see FIG. 1b, when the peripheral portion 16 of the cover 3 is fitted on the outer surface of the peripheral wall 5 of the frame 2, the elastic retaining portions 20 are elastically deformed outward by the peripheral wall 5, and a biasing force is produced from the elastic retaining portions 20 toward the outer surface of the peripheral wall 5. The elastic retaining portions 20 are pressed into contact with the peripheral wall 5 of the frame 2 by the biasing force. Consequently, the entire cover 3 is electrically connected to the frame 2 via the pressed contact portions, and is grounded to the ground portion of the circuit board 4 via the frame 2.

In this embodiment, see FIG. 1b, the joint portions between the frame 2 and the circuit board surface 4a are close to the pressed contact portions between the cover 3 and the frame 2. Therefore, the electrical distance between the circuit board surface 4a and the cover 3 is short, and the electrical resistance therebetween can be reduced. This can stabilize the ground potential of the cover 3. Because of limitations upon working accuracy, the degree of fitting between the peripheral wall 5 of the frame 2 and the peripheral portion 16 of the cover 3 may vary. In this embodiment, since the peripheral wall 5 of the frame 2 and the peripheral portion 16 of the cover 3 are in pressed contact with each other at the elastic retaining portions 20, even when the fitting degree between the frame 2 and the cover 3 slightly varies, an electrical connection can be most reliably established therebetween by elastic deformation of the elastic retaining portions 20. This can enhance reliability of the electrical connection between the frame 2 and the cover 3.

In order to further enhance reliability of the electrical connection between the frame 2 and the cover 3, the following feature is also provided in this embodiment. That is, the openings 17 of the cover 3 are smaller than the base ends of the protuberances 14 of the frame 2 so that the protuberances 14 are fitted in the openings 17 with little space for loose fitting. The contact areas between the protuberances 14 and the edges of the openings 17 can thereby be made larger than if the protuberances 14 were loosely fitted in the openings 17. That is, in this embodiment, the frame 2 and the cover 3 are electrically connected not only at the pressed contact portions between the peripheral wall 5 of the frame 2 and the elastic retaining portions 20 of the cover 3, but also at the contact portions between the protuberances 14 and the edges of the openings 17. For this reason, the contact area between the frame 2 and the cover 3 increases, and a more reliable electrical connection can be established therebetween. In this way, the cover 3 can be reliably grounded via the frame 2 in this embodiment, and therefore, shielding performance of the shield case 1 can be stabilized.

In this embodiment, the shield case 1 includes the frame 2 and the cover 3 that are fitted together, and the joint terminals 6 extend outward from the lower edge (close to the circuit board) of the frame 2 so as to be inclined upward. For this reason, when the frame 2 is mounted on the circuit board 4 by joining the joint terminals 6 to the circuit board surface 4a with the solder 7 provided therebetween, the amount of the solder 7 that is squeezed from between the joint terminals 6 and the circuit board surface 4a can be reduced. This prevents the solder 7 from flowing up the outer peripheral surface of the frame 2. For this reason, it is possible to prevent the solder 7 from lying at the fitting portions between the frame 2 and the cover 3, and to prevent the fitting state between the frame 2 and the cover 3 from being worsened by the solder 7.

Since the shield case 1 is reduced in size and thickness by the foregoing features, the fitting portions between the frame 2 and the cover 3 are close to the joint portions between the joint terminals 6 and the circuit board surface 4a. Therefore, there is a danger that the fitting state between the frame 2 and the cover 3 would be further worsened by the solder 7 if it were squeezed from between the joint terminals 6 and the circuit board surface 4a. In contrast, since the configuration of this embodiment prevents the solder 7 from flowing to the fitting portions between the frame 2 and the cover 3, even when the frame 2 and the cover 3 are small and thin, worsening of the fitting state therebetween can be avoided. Consequently, the ground potential of the cover 3 can be prevented from being unstable.

Further, in this embodiment, the combination protuberances 14 on the peripheral wall 5 of the frame 2 are provided in the regions where the joint terminals 6 are not provided. That is, the combination protuberances 14 of the frame 2 are spaced apart from the joint terminals 6. For this reason, the fitting between the combination protuberances 14 of the frame 2 and the combination openings 17 of the cover 3 is prevented from being hindered by the solder 7 that joins the joint terminals 6 to the circuit board surface 4a.

The present invention is not limited to this embodiment, and other various embodiments are possible. For example, while the protuberances 14 are provided as the combination fitting portions on the peripheral wall 5 of the frame 2 and the openings 17 are provided as the combination fitting portions in the peripheral portion 16 of the cover 3 in this embodiment, openings may alternatively be provided as the combination fitting portions in the peripheral wall 5 of the frame 2, and protuberances protruding inward may be provided as the combination fitting portions on the peripheral portion 16 of the cover 3. In this case, the peripheral portion 16 of the cover 3 is fitted on the outer surface of the peripheral wall 5 of the frame 2, the protuberances of the cover 3 are fitted in the openings of the frame 2, and the frame 2 and the cover 3 are thereby combined.

Further, while the protuberances and the openings are provided as the combination fitting portions in this embodiment, the combination fitting portions are not limited thereto as long as they can be fitted to combine the frame 2 and the cover 3.

While the joint terminals 6 of the frame 2 are inclined upward at an angle of 45° to the circuit board surface 4a in this embodiment, the angle of upward inclination with respect to the circuit board surface 4a may be appropriately determined within a range greater than 0° and less than 90°, in consideration of various respects, for example, the size of the joint terminals 6, the degree of upward flow of the solder 7, and a method for checking the state of the joint formed between the frame 2 and the cover 3 with the solder 7.

In this embodiment, the frame 2 has a plurality of positioning projections 12 so that it can be placed on the circuit board surface 4a with high positioning accuracy. However, for example, if the frame 2 is to be placed on the circuit board surface 4a with high positioning accuracy by using a high-performance device, only one positioning projection 12 or no positioning projection is needed on the frame 2. In this case, only one positioning hole 13 or no positioning hole is provided in the circuit board 4.

Further, while the solder 7 is used as the conductive joining material in this embodiment, conductive joining materials other than the solder may be used.

Figure 4:
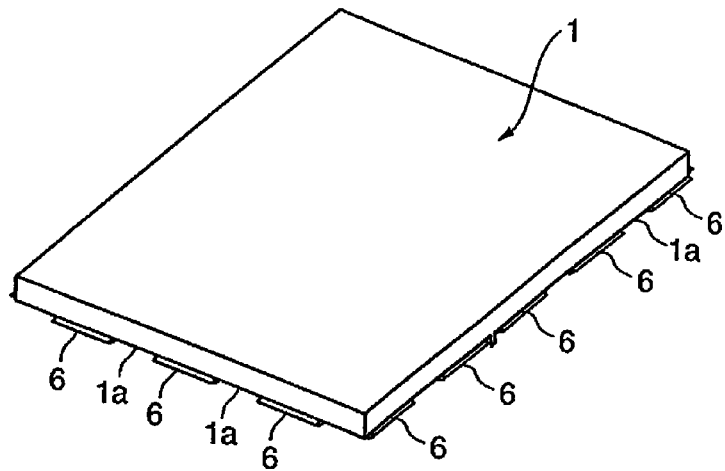
FIG. 4 is a model diagram of a shield case according to another embodiment.
Figure 4:
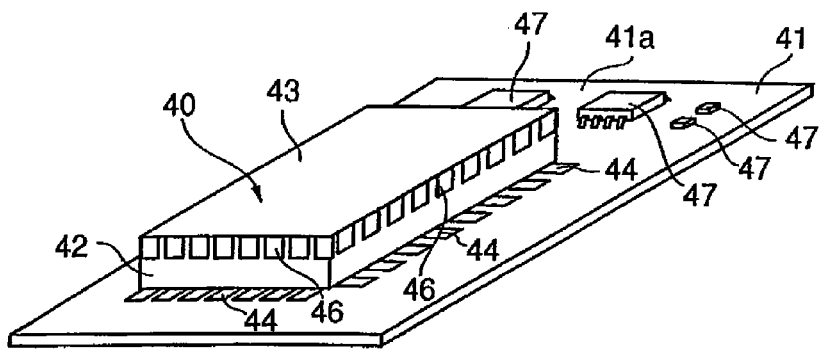
Figure 4:
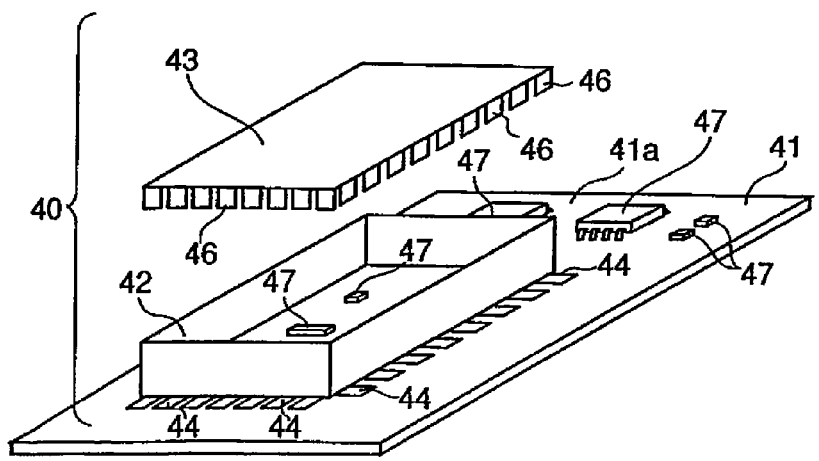
Figure 5C:
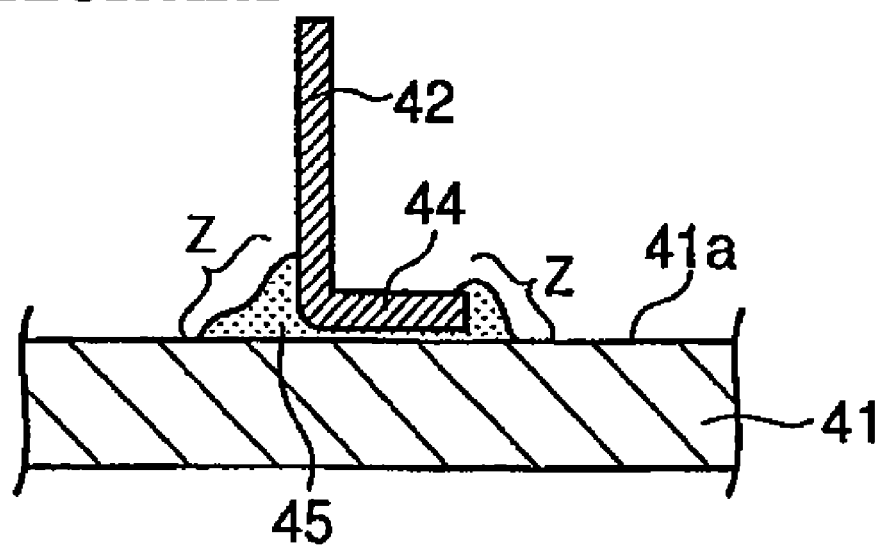
FIG. 5c is a cross-sectional view explaining an example of a joint state between a frame of the shield case shown in FIG. 5a, and a surface of a circuit board.

While the shield case 1 of this embodiment has a two-piece structure including the frame 2 and the cover 3, the present invention is also applicable to, for example, a shield case 1 having a one-piece structure, shown in FIG. 4 as a schematic perspective view. For example, joint terminals 6 provided in the shield case 1 shown in FIG. 4 extend outward and are inclined upward from a lower edge 1a that is to be in contact with the circuit board surface. Positioning projections (one being shown) may protrude downward from the lower edge of the shield case 1 shown in FIG. 4. By fitting the projections in holes provided in the circuit board 4, the shield case 1 can be positioned and fixed to the circuit board 4.

The present invention is applicable to a shield case for being fixed to a surface of a circuit board by a conductive joining material for covering a shielded portion on the surface of the circuit board, and is effective particularly for providing a small and thin shield case.

Although the present invention has been described in relation to particular embodiments thereof, many other variations and modifications and other uses will become apparent to those skilled in the art. Therefore, the present invention is not limited by the specific disclosure herein.

The invention claimed is:

1. A shield case adapted to be fixed to a surface of a circuit board with a conductive joining material so as to cover a shielded portion on the surface of the circuit board, the shield case comprising:
   a frame made of a conductor;
   a cover made of a conductor and arranged to be fitted on and combined with the frame; and
   joint terminals extending outwardly and upwardly from a lower edge of the frame such that an outermost end of each of the joint terminals is spaced farther from the surface of the circuit board than all other portions of the respective joint terminal, the joint terminals being disposed in contact with the surface of the circuit board; wherein
   the frame is fixed and grounded to a ground portion of the surface of the circuit board by conductive joining material provided between the joint terminals and the surface of the circuit board;
   the cover includes a peripheral portion; and
   the peripheral portion of the cover includes a plurality of elastic retaining portions that are arranged to be elastically deformed outwardly by the frame when the cover is fitted on and combined with the frame so as to produce a biasing force applied to the frame such that the plurality of elastic retaining portions are in pressing contact with and electrically connected to the frame.

2. The shield case according to claim 1, wherein the frame includes a peripheral wall having a lower edge in contact with the surface of the circuit board, and the joint terminals extend outwardly and upwardly from the lower edge of the peripheral wall of the frame so as to be disposed at intervals along the peripheral wall; and
   the peripheral portion of the cover is arranged to be fitted on an outer surface of the peripheral wall of the frame, and the plurality of elastic retaining portions are arranged to be in pressing contact with portions of the peripheral wall of the frame corresponding to the joint terminals so as to be electrically connected to the frame.

3. The shield case according to claim 2, wherein the peripheral wall of the frame and the peripheral portion of the cover respectively include combination fitting portions that are arranged to be fitted together to combine the frame and the cover, and the combination fitting portion of the peripheral wall of the frame is provided in a portion of the frame in which the joint terminals are not provided.

4. The shield case according to claim 3, wherein a positioning projection protrudes downward from the lower edge of the peripheral wall of the frame, and is arranged to be fitted in a positioning hole provided in the circuit board to so as position the frame on the circuit board.

5. The shield case according to claim 2, wherein a positioning projection protrudes downward from the lower edge of the peripheral wall of the frame, and is arranged to be fitted in a positioning hole provided in the circuit board so as to position the frame on the circuit board.

6. The shield case according to claim 3, wherein the combination fitting portions comprise a protuberance on one of the cover and the frame and a corresponding opening in the other of the cover and the frame.

7. The shield case according to claim 6, wherein the protuberance has an outside dimension which is greater than a corresponding inside dimension of the opening.

8. The shield case according to claim 1, wherein a positioning projection protrudes downward from the lower edge of the peripheral wall of the frame, and is arranged to be fitted in a positioning hole provided in the circuit board so as to position the frame on the circuit board.

9. A shield case adapted to be fixed to a surface of a circuit board with a conductive joining material so as to cover a shielded portion on the surface of the circuit board, the shield case comprising:
   a frame made of a conductor;
   a cover made of a conductor and arranged to be fitted on and combined with the frame; and
   joint terminals extending outwardly and upwardly from a lower edge of the frame such that an outermost end of each of the joint terminals is arranged to be spaced farther from the surface of the circuit board than all other portions of the respective joint terminal, the joint terminals being arranged to be in contact with the surface of the circuit board such that the frame can be fixed and grounded to a ground portion of the surface of the circuit board by conductive joining material provided between the joint terminals and the surface of the circuit and
   the cover includes a peripheral portion; and
   the peripheral portion of the cover includes a plurality of elastic retaining portions that are arranged to be elastically deformed outwardly by the frame when the cover is fitted on and combined with the frame so as to produce a biasing force applied to the frame such that the plurality of elastic retaining portions are in pressing contact with and electrically connected to the frame.

10. The shield case according to claim 9, wherein a positioning projection protrudes downward from a lower edge of a peripheral wall of the frame, and is arranged to be fitted in a positioning hole provided in the circuit board to so as position the frame on the circuit board.

11. The shield case according to claim 9, wherein
    the frame includes a peripheral wall having a lower edge arranged to be in contact with the surface of the circuit board, and the joint terminals extend outwardly and upwardly from a lower edge of the peripheral wall of the frame and are disposed at intervals along the peripheral wall;
    the peripheral portion of the cover is arranged to be fitted on an outer surface of the peripheral wall of the frame, and the plurality of elastic retaining portions are arranged to be in pressing contact with portions of the peripheral wall of the frame corresponding to the joint terminals so as to be electrically connected to the frame.

12. The shield case according to claim 11, wherein a positioning projection protrudes downward from the lower edge of the peripheral wall of the frame, and is arranged to be fitted in a positioning hole provided in the circuit board so as to position the frame on the circuit board.

13. The shield case according to claim 11, wherein the peripheral wall of the frame and the peripheral portion of the cover respectively include combination fitting portions that are arranged to be fitted to combine the frame and the cover, and the combination fitting portion of the peripheral wall of the frame is provided in a portion of the frame in which the joint terminals are not provided.

14. The shield case according to claim 12, wherein a positioning projection protrudes downward from the lower edge of the peripheral wall of the frame, and is arranged to be fitted in a positioning hole provided in the circuit board to so as position the frame on the circuit board.

15. The shield case according to claim 13, wherein the combination fitting portions comprise a protuberance on one of the cover and the frame and a corresponding opening in the other of the cover and the frame.

16. The shield case according to claim 15, wherein the protuberance has an outside dimension which is greater than a corresponding inside dimension of the opening.

* * * * *